(12) United States Patent
Hunkeler et al.

(10) Patent No.: US 7,161,087 B2
(45) Date of Patent: Jan. 9, 2007

(54) MODULE ASSEMBLY WITH MOUNTING INTEGRITY DETECTION INCLUDING DEFORMABLE WASHER

(75) Inventors: Hugh R. Hunkeler, Kokomo, IN (US); James F. Patterson, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 60 days.

(21) Appl. No.: 11/069,249

(22) Filed: Mar. 1, 2005

(65) Prior Publication Data
US 2006/0198110 A1    Sep. 7, 2006

(51) Int. Cl.
*H01B 17/26* (2006.01)

(52) U.S. Cl. .............................. 174/153 G; 174/138 G; 174/152 G; 174/480; 174/506; 174/650; 174/651; 174/652; 174/656; 174/657; 174/659; 174/660; 174/662; 174/665; 174/668; 174/669; 219/245

(58) Field of Classification Search ............ 174/153 G, 174/138 G, 152 G, 65 G
See application file for complete search history.

(56) References Cited

OTHER PUBLICATIONS

Research Disclosure, Electric Control Unit Mounting Integrity Diagnostic, publication No. 453067, Jan. 2002 issue, p. 45.

*Primary Examiner*—Dean A. Reichard
*Assistant Examiner*—Anton B. Harris
(74) *Attorney, Agent, or Firm*—Jimmy L. Funke

(57) ABSTRACT

A module is mounted to a object with a fastener and a special washer. The fastener engages the object through a mounting opening in mounting portion of a module case. The washer has a first portion extending obliquely outward and downward to be deformed between the fastener head and an electrically non-conducting surface of the mounting portion and thus increase a mounting force on the module with mounting advancement of the fastener. The washer has a second portion extending axially into the internal opening to contact an electrically conducting insert therein and thus create a series electrical circuit from the typically grounded object through the fastener, washer and insert to a detecting circuit, which verifies that the module is securely mounted with a predetermined mounting force.

8 Claims, 3 Drawing Sheets

MODULE ASSEMBLY WITH MOUNTING INTEGRITY DETECTION INCLUDING DEFORMABLE WASHER

TECHNICAL FIELD

The technical field of this invention is module assemblies.

BACKGROUND OF THE INVENTION

This invention relates to modules adapted for secure mounting and retention on an object. An example of such an assembly is an electronic sensor and/or control module including an accelerometer and acceleration signal processing apparatus designed to sense the acceleration of the object for the control of a system on the basis of the sensed and processed acceleration signal. Such modules are, for example, mounted on vehicle members in vehicle seat occupant sensing and/or characterization systems for controlling the deployment of passive vehicle restraint devices such as airbags in a vehicle crash. A module used in this manner may include apparatus for sensing vertical acceleration of a seat occupant in an occupant weight sensing system to assist in determining to what extent an indicated occupant weight is actually due to the downward force exerted by a tightly cinched seat belt. Such modules may also, or alternatively, be mounted on vehicle body members for sensing their horizontal accelerations and/or to provide a crash sensing signal.

If a nodule including an accelerometer in such a system is not securely fixed to the object on which it is mounted, the accelerometer may not share the true acceleration of the object, particularly in high accelerations; and the output acceleration signal may thus not accurately represent the acceleration of the object. A system for detecting a secure mounting of the module provides a higher degree of confidence in the reliability of such an accelerometer signal.

In a prior art publication, Research Disclosures No. 453067, published January 2002, an apparatus is described as shown in FIG. 1-3 herein. A case 10 of a module has a main portion 14 and one or more mounting portions 12. A fastener 20 is shown as a bolt having a head 22 and a cylindrical, threaded shank 24. Shank 24 is inserted through a mounting opening 11 in mounting portion 12 and threadably engages an aligned opening 17 in object 18, which may be a member of a vehicle. Head 22 provides an interface for a torque generating tool to threadably advance shank 24 into object 18. Case 10 is made of an electrically non-conducting material such as a thermoplastic resin, and object 18 is made of an electrically conducting material such as steel or aluminum. An electrically conducting insert 26 is molded into case 10 but projects out of and lays on an upper surface 19 of mounting portion 12 around the mounting opening 11. Electrically conducting insert 26 is prevented from lateral contact with shank 24 of fastener 20, if necessary by an insulating sleeve, not shown.

Electrically conducting insert 26 further contacts an additional fastener 28, which secures one end of a circuit board 16 to case 10 within its main portion 14. An electronic circuit includes a circuit trace 36, shown only schematically in FIG. 3 but preferably provided on the underside of circuit board 16, with a portion of the circuit trace surrounding an opening in circuit board 16 through which fastener 28 projects. Fastener 28, in its securely fastening position, contacts both the circuit trace 36, through its head on the underside of circuit board 16, and electrically conductive insert 26, for example through a stepped diameter portion of its shank as shown, to provide electrical contact between insert 26 and circuit trace 36. For this reason, fastener 28 is shown schematically as a switch 28 connecting conductors 26 and 36 in the circuit diagram of FIG. 3.

An electrically conducting washer 30 is provided with fastener 20. This washer surrounds shank 24 directly underneath head 22 and has a frustro-conical shape. As seen in FIG. 1, wherein the apparatus is shown before case 10 is securely fastened to object 18, washer 30 is undistorted: with an outer circumferential edge contacting surface 19 of mounting portion 12 radially outside electrically conducting insert 26 so that it is not in electrical contact therewith. In torqued advancement of fastener 20 downward through mounting portion 12 into object 18, head 22 of fastener 20 provides a downward force on the inner edge of washer 30 to progressively distort washer 30 in a flattening manner until the washer physically and electrically contacts the exposed portion of electrically conducting insert 26, as shown in FIG. 2. This contact establishes a series electrical circuit from object 18, through fastener 20 and washer 30 to electrically conducting insert 26, and continuing through fastener 28 to circuit trace 36 on circuit board 16. FIG. 3 shows this arrangement schematically, with a circuit trace representing object 18 being connected to circuit trace 36 in series through (1) a switch representing fastener 20 and washer 30, (2) a circuit trace representing electrically conducting insert 26, and (3) a switch representing fastener 28. Object 18 is typically grounded to the vehicle chassis; and circuit board 16 further includes other electrical components providing a ground detection circuit, in which a resistor $R_2$, circuit trace 36 and the two switches (20,30 and 28) described above are connected in series between a voltage reference VREF and ground (object 18), while a resistor $R_1$ is connected between circuit trace 36 and an input of a microcomputer 40 programmed with an algorithm to detect by the presented input voltage whether both of the switches are closed.

The operation of the arrangement is based on the fact that a secure mounting of case 10 of the module on object 18 requires a specified clamping force exerted by one or more of the fasteners 20 on its respective mounting portion 12; and achievement of each specified clamping force may be inferred from the distortion of the respective washer to contact the respective electrically conductive insert 26 and thus effectively "close" switch 20,30 (providing switch 28 is also "closed").

But this prior art arrangement has a disadvantage, in that a normal, flat washer may be substituted for the frustro-conical washer, particularly in a repair or replacement activity. Electrical contact in such case may be achieved between fastener 20 and washer 30 with a minimal clamping force that does not guarantee a secure mounting of the module, and the design specifications on which the validity of the accelerometer signal would no longer apply. It would be desirable to modify this prior art arrangement to prevent such an occurrence.

SUMMARY OF THE INVENTION

The invention is a module assembly having a case with at least one electrically non-conducting mounting portion having an internal wall defining a mounting opening therethrough. The mounting portion also contains an electrically conducting insert extending partly into the mounting opening internally of the mounting portion and adapted for connection to an electric potential detecting circuit.

The assembly also includes an electrically conducting fastener comprising a head and a shank. At least one portion of the internal wall of the mounting portion is adapted for guiding the shank through the mounting opening into mounting engagement with an object with no contact between the shank and the electrically conducting insert.

The assembly further includes an electrically conducting washer surrounding the shank adjacent its head. The washer has at least one first portion extending obliquely outward and away from the head of the fastener to be deformed between the head of the washer and a surface of the mounting portion and thereby exert a mounting force on the case as the fastener is advanced through the mounting opening into engagement with the object. The first portion of the washer may, be generally frustro-conical in shape and may comprise a plurality of obliquely, radially extending spokes joined at their outer ends in an annular member.

The washer also has at least one second portion projecting from the first portion adjacent the head of the fastener axially away from the head and adjacent the shank into the mounting opening. The second portion of the washer may, for example, be in the form of a cylindrical member around the shank of the fastener; but, whatever its specific shape, it is adapted to engage the electrically conducting insert within the mounting opening in the same advancement of the shank when the mounting force exerted on the case by the deformed washer reaches a predetermined value. The second portion of the washer may be retained on a non-threaded portion of the shank of the fastener between the head of the fastener and a threaded portion thereof. The engagement of the second portion of the washer with the electrically conducting insert completes a series circuit from the electrically conducting insert through the washer and the fastener to the object at the reference potential to signals the achievement of the predetermined mounting force when the object is maintained at a predetermined reference potential and the electrically conducting insert is connected to a potential detecting circuit. Since the electrically conducting insert can be contacted by the washer only within the internal opening of the non-conducting mounting portion of the case, a substitute flat washer outside the mounting portion of the case will not be able to contact the electrically conducting insert for generation of the validating signal.

The invention provides an advantage in any application in which confirmation of the secure mounting of a module on an object is desired. Such applications abound throughout industry and technology and are not limited to movable objects such as vehicles or modules with sensors.

BRIEF DESCRIPTION OF THE DRAWINGS

The present invention will now be described, by way of example, with reference to the accompanying drawings, in which.

DESCRIPTION OF THE PREFERRED EMBODIMENT

Figure 4:
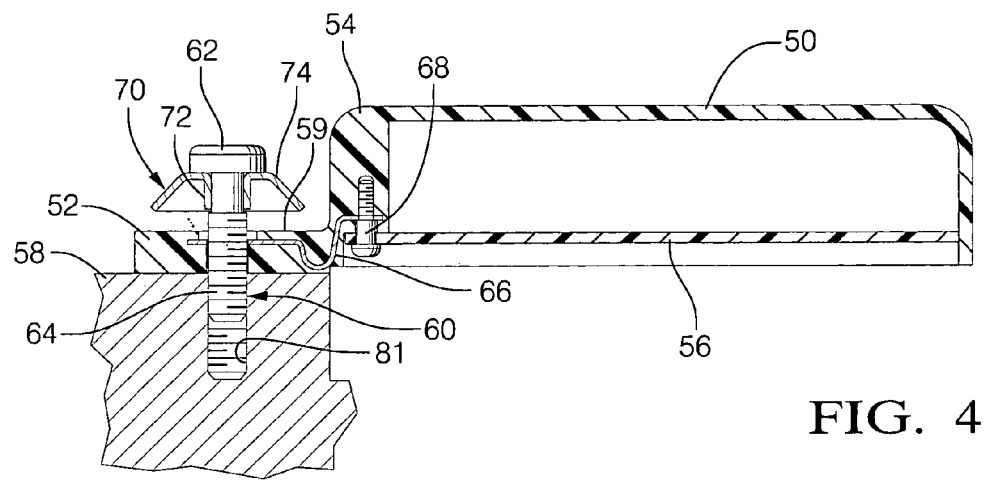
FIG. 4 is a sectional view of a preferred embodiment of a module assembly according to this invention before secure mounting on an object.

Referring to FIG. 4, a case 50 of the module assembly has a main portion 54 and one or more mounting portions 52, which may be in the form of brackets extending from main portion 54. In one example, there may be three such mounting portions 52, with two of the mounting portions extending from one side near two corners of the case and one extending from the opposite side. A fastener 60 is shown as a bolt having a head 62 and a shank 64, 65 projecting from head 62 and preferably cylindrical in shape. In this embodiment, portion 64 of the shank is threaded, and portion 65 thereof, which separates portion 64 from head 62, may be unthreaded and of slightly smaller diameter than the threads of portion 64, for reasons to be explained below. Shank 64, 65 is inserted through a mounting opening 100 in mounting portion 52 and is adapted, by threaded portion 64, for engagement with an internal wall 81 defining an aligned opening into an object 58 that is physically located on a side of the mounting portion opposite head 62 of fastener 60. Case 50 is thus adapted to be attached to object 58 by means of fastener 60 and, preferably, by similar fasteners associated with the other mounting portions 52. Head 62 preferably provides an interface, such as a standard hex head, for a torque generating tool to threadably advance shank 64, 65 through mounting portion 52 into object 58. With each mounting portion 52 firmly affixed to object 58 by its respective fastener, case 50 and its contents, including any accelerometers within, will share in accelerations and other movements of object 58, which may for example be part of, or attached to, a vehicle.

Figure 1:
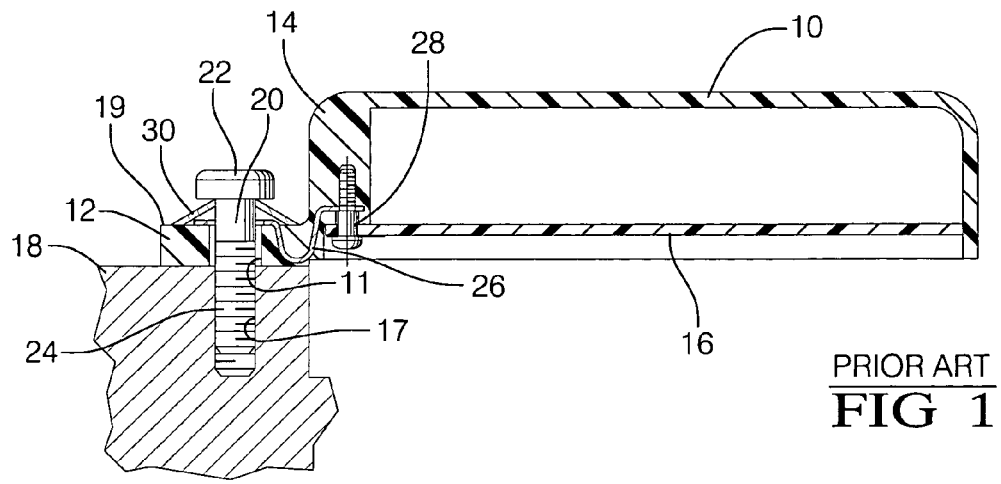
FIG. 1 is a sectional view of a module assembly of the prior art before secure mounting on an object.
Figure 2:
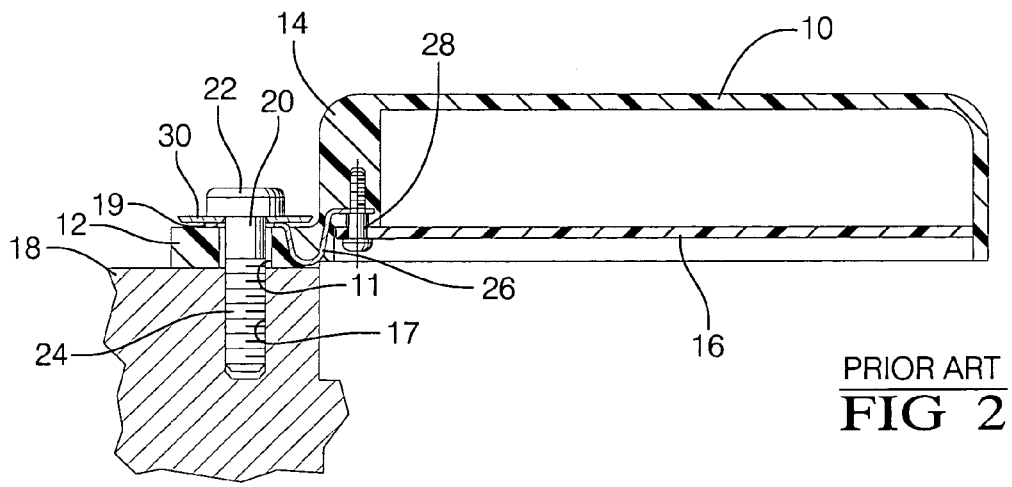
FIG. 2 is a sectional view of a module assembly of the prior art after secure mounting on an object.

Case 50 is made of an electrically non-conducting material such as a thermoplastic resin; and object 58 is made of an electrically conducting material such as steel or aluminum. Object 58 is connected to a reference electrical potential: for example, vehicle chassis ground in the case of a vehicle member. An electrically conducting insert 66, preferably made of an electrically conducting metal such as steel, aluminum or copper, is molded into case 50 and extends into mounting opening 100 below an upper surface 59 of the mounting portion 52 surrounding opening 100 (directional references such as "up" and "down" in this description refer to relative directions in the drawings of this document and are not meant to limit the mounting orientation of the module). Electrically conducting insert 66 is prevented from direct contact with shank 64, 65 of fastener 60, for example with a non-conducting sleeve or in a manner to be described below. Electrically conducting insert 66 further contacts an additional fastener 68 that secures one end of a circuit board 56 to main portion 54 of case 50 internally and is simultaneously connected thereby to one or more circuit traces on the circuit board, for example in the same manner as described for the prior art embodiment of FIG. 1–3.

An electrically conducting washer 70 is provided along with fastener 60. Washer 70 has an inner portion 72 that is preferably cylindrically tubular and one or more outer portions 74 that extend obliquely outward from an end 75 of inner portion 72 that is closest to head 62 of fastener 60, the oblique direction being intermediate a radially horizontal direction and an axial direction toward the opposite end 76 of inner portion 72 (away from head 62 of fastener 60). This washer surrounds the upper region 65 of shank 64, 65, with inner portion 72 conforming to and preferably being carried on axial region 65 of shank 64, 65, beneath and adjacent head 62. In the embodiment shown, axial region 65 of the shank, adjacent head 62, is smaller in outer diameter than axial region 64 of the shank. This is preferred so as to allow permanent retention of washer 70 on axial region 65 of the shank before and during attachment of case 50 to object 58 and may be produced by rolling the threads on the shank after the washer is slipped onto the shank.

Figure 6:
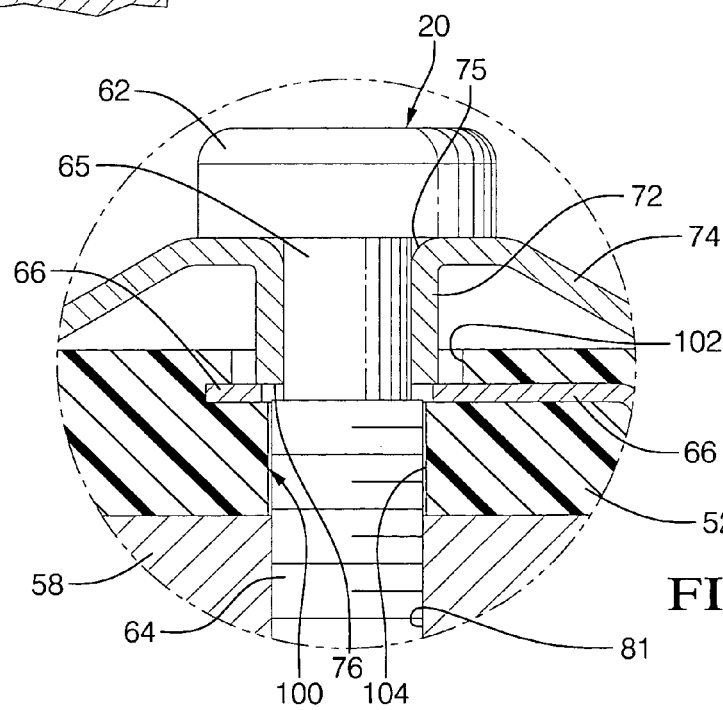
FIG. 6 is an enlarged view of a portion of FIG. 5.

In the embodiment described, fastener 60 is prevented from contacting electrically conducting insert 66 directly in the following manner. Mounting opening 100 is defined by an inner wall that is stepped in two distinct axial portions 102 and 104 having different diameters. The larger diameter axial portion 102 (the upper axial portion in FIG. 6) is located closer to surface 59 and is provided with a first diameter that permits insertion of fastener 60 and inner portion 72 of washer 70 without hindrance. The smaller diameter axial portion 104 (the lower axial portion in FIG. 6) is located on the opposite axial side of larger diameter axial portion 102 from surface 59; and its diameter is preferably designed to receive and retain portion 64 of fastener 60 in a predetermined axial alignment and orientation. The electrically conducting insert is preferably located axially so as to extend into opening 100 from the larger diameter axial portion 102 adjacent and above the boundary between axial portions 102 and 104, so that it may be contacted axially by (lower) end 76 of inner portion 72 of washer 70. But no part of electrically conducting insert 66 enters a circularly cylindrical space in axial portion 102 of mounting opening 100 defined by an upward extension of the smaller diameter of axial portion 104 of mounting opening 100 or otherwise approaches that circularly cylindrical space sufficiently closely as to allow contact with fastener 60 when the latter is retained in smaller diameter axial portion 104. This may be preferably be facilitated by ensuring that electrically conducting insert 66 is spaced outwardly by a specified margin from a cylinder defined by the smaller diameter axial portion 104. Alternative and/or equivalent arrangements for preventing such electrical contact will be apparent to those skilled in the art.

Figure 5:
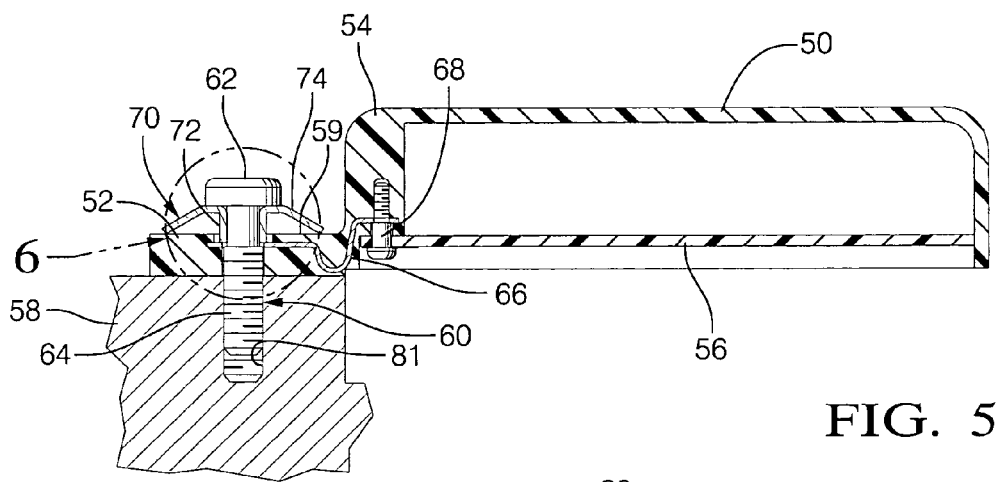
FIG. 5 is a sectional view of the embodiment of FIG. 4 after secure mounting on an object.

FIG. 4 shows the apparatus with shank 64, 65 of fastener 60 inserted though mounting opening 100 and partially advanced into opening 81 in object 58; but no outer portion 74 of washer 70 yet contacts upper surface 59 of mounting portion 52. In this position, outer portion(s) 74 of washer 70 are not distorted from their pre-installed shape relative to inner portion 72; and end 76 of the latter is not in contact with electrically conducting insert 66. As fastener 60 is advanced further through mounting opening 100 into object 58, the outer portion(s) 74 of washer 70 will eventually contact upper surface 59 of mounting portion 52, as shown in FIG. 5, and begin to distort. In the embodiment shown, the distortion will include at least a flattening reduction in the oblique angle of outer portion(s) 74 from the horizontal. With this distortion, the outer portion(s) 74 of washer 70 will begin to exert a retaining force on mounting portion 52 with respect to object 58; and this force will generally increase with the growing distortion as fastener 60 is further advanced into object 58.

Finally, as shown in FIG. 5, fastener 60 has been advanced axially into object 58 to the point where end 76 of inner portion 72 makes contact with electrically conducting insert 66 within mounting opening 100. Fastener 60 is designed so that, when this point is reached, the retaining force provided to mounting portion 52 relative to object 58 has grown to at least a predetermined minimum desired mounting force required to hold mounting portion 52 in firm contact against object 58 according to predetermined specifications. The physical contact between fastener 60 and electrically conducting insert 66 establishes an electrical grounding circuit from vehicle ground through object 58, fastener 60, washer 70, electrically conducting insert 66, fastener 68 and circuit trace 36 to a detecting circuit on circuit board 56, which may be the prior art circuit shown in FIG. 3 applied to the apparatus of FIG. 4-6 in the same manner as it is shown applied to the prior art apparatus of FIGS. 1 and 2. The detecting circuit signals, based on detection of the contact, that the desired mounting force has been achieved; and the advance of the fastener may be terminated.

Figure 3:
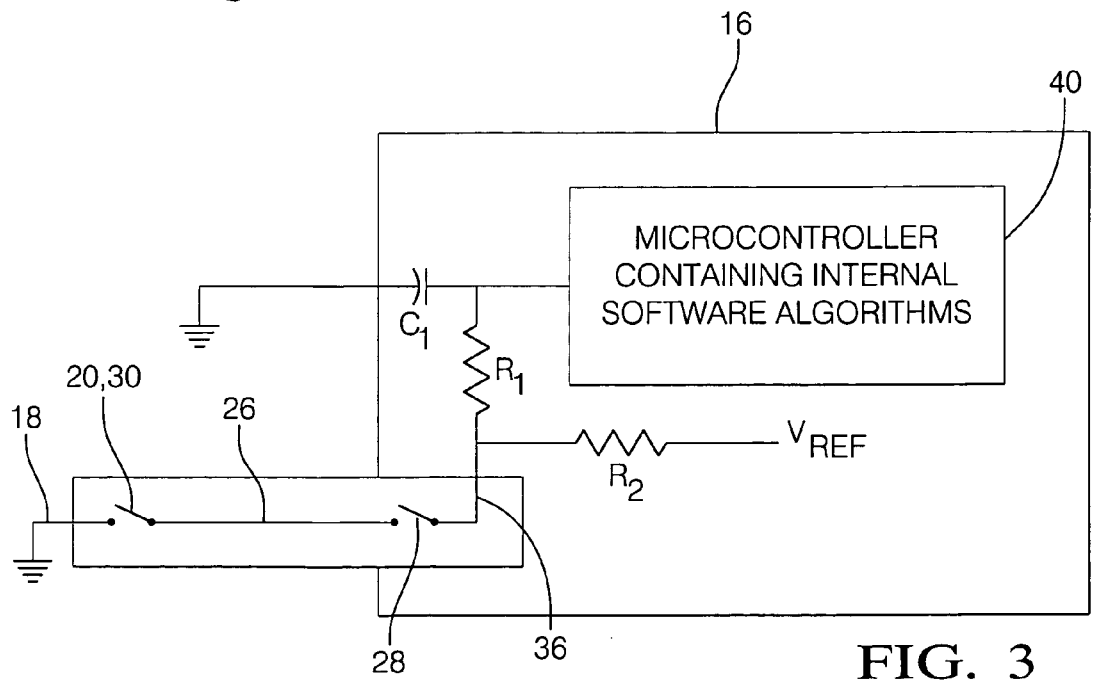
FIG. 3 is a schematic view of a secure mounting detection apparatus for use with the prior art arrangement of FIGS. 1 and 2 and the arrangement of FIG. 4-6.

If, on the other hand, a standard, flat washer is used with a standard bolt with the circuit of FIG. 3 applied to the apparatus of the invention, the required contact between the washer and the electrically conducting insert cannot be achieved, since the conducting insert is internal to the mounting portion of the case and the washer requires a portion such as inner portion 72 projecting into the mounting opening in order to make the contact. Thus, the problem of the prior art arrangement is eliminated.

But the advantage of this invention is not limited to the initial mounting of the module in the factory environment. In use, the circuit of FIG. 3 continues to monitor the contact between washer 70 and electrically conducting insert 66. If the retaining force on the module loosens sufficiently that this contact is broken, even intermittently, this fact will be detected; and a warning can be provided that the module is no longer reliably retained. Of course, if the module is re-mounted or removed and replaced in service, the detection of sufficient force for reliable mounting will be provided automatically in the service just as it was in the initial mounting in the factory environment.

Figure 7:
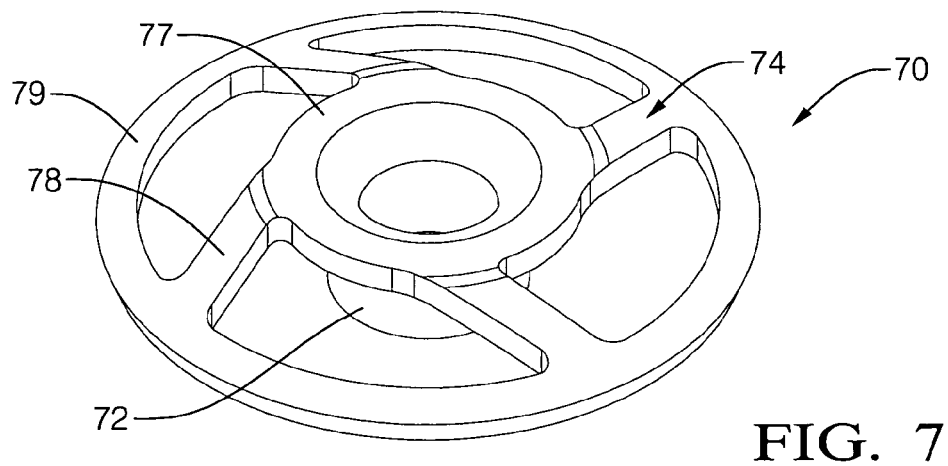
FIG. 7-9 show perspective views of three suggested embodiments of washers for use in the module assembly of this invention.
Figure 8:
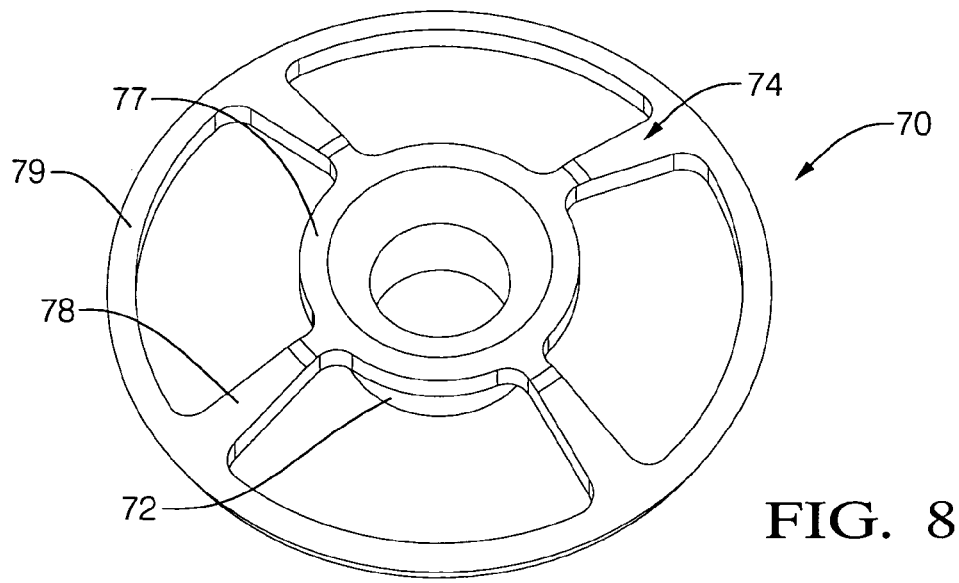
Figure 9:
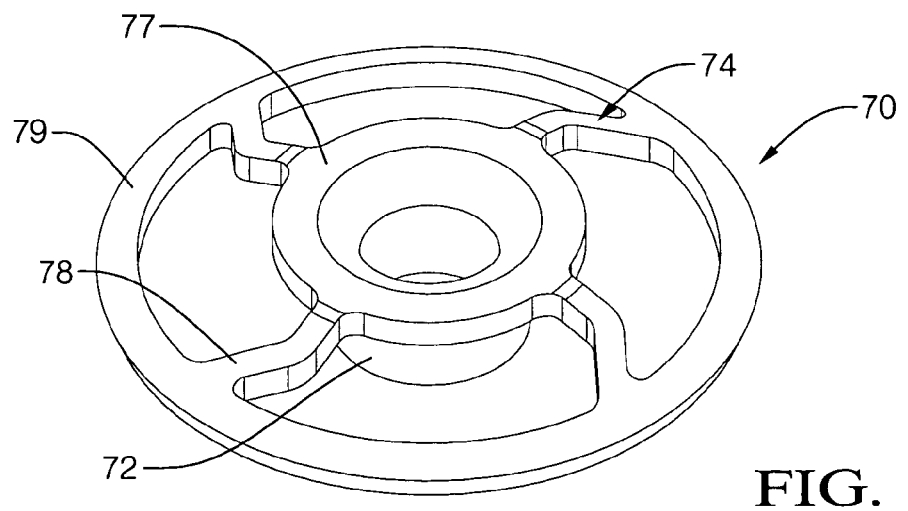

FIG. 7-9 show several possible embodiments of washer 70, with similar reference numerals indicating similar portions of the washer. Each has an inner portion 72 comprising a circular cylinder with a lower end 76 and an upper end 75 that may be extended outwardly in a circular flange 77. Outer portions 74 of the washer are shown as spokes 78 and are joined in an annular portion 79 at their radially outward ends. The differences between the embodiments lie in the orientation and shape of the spokes of outer portions 74. Spokes 78 of outer portions 74 in FIG. 7, looking downward on the washer, are straight and project essentially tangentially from flange 77. Spokes 78 of outer portions 74 in FIG. 8, looking downward on the washer, are straight and project radially from flange 77. Spokes 78 of outer portions 74 in FIG. 9, looking downward on the washer, project from flange 77 initially radially but are bent in an acute angle from the radial before joining circular portion 79. Of course, in each case, spokes 78 of outer portions 74 are angled downwardly as previously described, to descend from flange 77 at the upper end 75 of washer 70 to circular portion 79 in a plane spaced downwardly from flange 77. Of course, essentially equivalent variations of the embodiments shown will occur to those of ordinary skill in the art and are meant to be included in the washers of the invention.

The invention claimed is:

1. A module assembly comprising:
   a case having at least one electrically non-conducting mounting portion with an internal wall defining a mounting opening therethrough,
   an electrically conducting insert molded into the mounting portion and extending partly into the mounting opening below an upper surface of the mounting portion surrounding said opening, an electrically conducting fastener comprising a head and a shank, at least one portion of the internal wall of the mounting portion being adapted for guiding the shank therethrough for mounting engagement with an object but without contacting the electrically conducting insert, an electrically conducting washer surrounding the shank adjacent the head thereof, the washer having at least one first portion extending obliquely outward and away from the head of the fastener to be deformed between the head of the washer and a surface of the mounting portion and thereby exert a mounting force on the case as the fastener is advanced through the mounting opening into engagement with the object, the washer having a second portion adjacent the head of the fastener that projects in a direction axially away from the head into the mounting opening to engage the electrically conducting insert below the upper surface of the mounting portion as the fastener is advanced to complete a series circuit from the electrically conducting insert through the washer and the fastener to the object and thus signal the achievement of a desired mounting force.

2. The module assembly of claim 1 wherein the first portion of the washer comprises at least one portion of a frustro-conical surface.

3. The module assembly of claim 1 wherein the first portion of the washer comprises a plurality of obliquely radial spokes joined at their radially outward ends by an annular portion.

4. The module assembly of claim 1 wherein the second portion of the washer comprises a cylindrical member around the shank of the fastener.

5. The module assembly of claim 1 wherein the engagement of the shank of the fastener with the object is a threaded engagement.

6. The module assembly of claim 1 wherein the internal wall of the mounting portion comprises a first axial portion located on an opposite axial side of the electrically conducting insert from the surface of the mounting portion and a second axial portion of the internal wall of the mounting portion located on the same axial side of the electrically conducting insert as the surface of the mounting portion, and the first axial portion of the internal wall receives the shank of the fastener and prevents contact thereof with the electrically conducting insert.

7. The module assembly of claim 6 wherein the first axial portion of the internal wall of the mounting portion defines a first cylindrical region having a first radius that receives the shank of the fastener, the electrically conducting insert is confined radially outside a second cylindrical region coaxial with the first cylindrical region and having a second radius larger than the first radius, and the second axial portion of the internal wall of the mounting portion is confined radially outside a third cylindrical region of the mounting portion coaxial with the first cylindrical region and having a third radius greater than the second radius.

8. The module of claim 1 wherein the shank has a threaded axial portion separated from the head by a non-threaded portion and the second portion of the washer comprises a cylindrical member that surrounds and is retained on the non-threaded portion by the threaded portion.

* * * * *